United States Patent
Chen

(10) Patent No.: US 9,171,770 B2
(45) Date of Patent: Oct. 27, 2015

(54) ELECTRONIC DEVICE AND MANUFACTURING METHOD THEREOF

(71) Applicants: UNIVERSAL SCIENTIFIC INDUSTRIAL (SHANGHAI) CO., LTD., Shanghai (CN); UNIVERSAL GLOBAL SCIENTIFIC INDUSTRIAL CO., LTD., Nantou County (TW)

(72) Inventor: Jen-Chun Chen, New Taipei (TW)

(73) Assignees: Universal Scientific Industrial (Shanghai) Co., Ltd., Shanghai (CN); Universal Global Scientific Industrial Co., Ltd., Nantou County (TW)

(*) Notice: Subject to any disclaimer, the term of this patent is extended or adjusted under 35 U.S.C. 154(b) by 179 days.

(21) Appl. No.: 13/745,827

(22) Filed: Jan. 20, 2013

(65) Prior Publication Data

US 2014/0070395 A1 Mar. 13, 2014

(30) Foreign Application Priority Data

Sep. 7, 2012 (TW) .............................. 101132847 A

(51) Int. Cl.
| | | |
|---|---|---|
| *H01L 23/552* | (2006.01) | |
| *H01L 23/04* | (2006.01) | |
| *H01L 23/12* | (2006.01) | |
| *H01L 21/00* | (2006.01) | |
| *H01L 23/31* | (2006.01) | |
| *H01L 21/56* | (2006.01) | |
| *H01L 23/00* | (2006.01) | |

(52) U.S. Cl.
CPC ............ *H01L 23/3171* (2013.01); *H01L 21/56* (2013.01); *H01L 23/3121* (2013.01); *H01L 23/552* (2013.01); *H01L 24/97* (2013.01); *H01L 21/561* (2013.01); *H01L 2224/16145* (2013.01); *H01L 2224/16225* (2013.01); *H01L 2224/97* (2013.01); *H01L 2924/12041* (2013.01); *H01L 2924/1306* (2013.01); *H01L 2924/13091* (2013.01); *H01L 2924/15788* (2013.01); *H01L 2924/1815* (2013.01); *H01L 2924/19041* (2013.01); *H01L 2924/19043* (2013.01); *H01L 2924/19105* (2013.01)

(58) Field of Classification Search
CPC ..... H01L 23/31; H01L 23/552; H01L 21/561; H01L 2924/1815; H01L 23/3171; H01L 21/56; H01L 23/3121; H01L 24/97; H01L 2224/97
USPC .......... 257/700, 660, 698, E21.502, E21.504; 438/127, 112

See application file for complete search history.

(56) References Cited

U.S. PATENT DOCUMENTS

| | | | | |
|---|---|---|---|---|
| 2004/0140573 A1* | 7/2004 | Pu et al. | ......................... | 257/782 |
| 2008/0105967 A1* | 5/2008 | Yang et al. | ..................... | 257/690 |
| 2011/0018119 A1* | 1/2011 | Kim et al. | ...................... | 257/690 |

* cited by examiner

*Primary Examiner* — Fernando L Toledo
*Assistant Examiner* — Aaron Gray
(74) *Attorney, Agent, or Firm* — Foley & Lardner LLP; Cliff Z. Liu; Angela D. Murch

(57) ABSTRACT

An electronic device and the manufacturing method thereof are provided. The method comprises providing a module, in which the module includes a substrate, at least one component mounted on the substrate and a molding, and the molding encapsulates the component and a portion of the substrate; forming a first hole to expose a ground pad of the component; forming a first conductive layer which covers the module and is electrically connected to the ground pad.

14 Claims, 17 Drawing Sheets providing a substrate, at least one component and a molding, wherein the component is disposed on the substrate, and the molding encapsulates the component and a portion of the substrate —S1 forming the first hole on the molding to expose the ground pad of the component —S2 forming the first conductive layer covering the module and electrically connected to the ground pad of the component —S3

FIG. 2

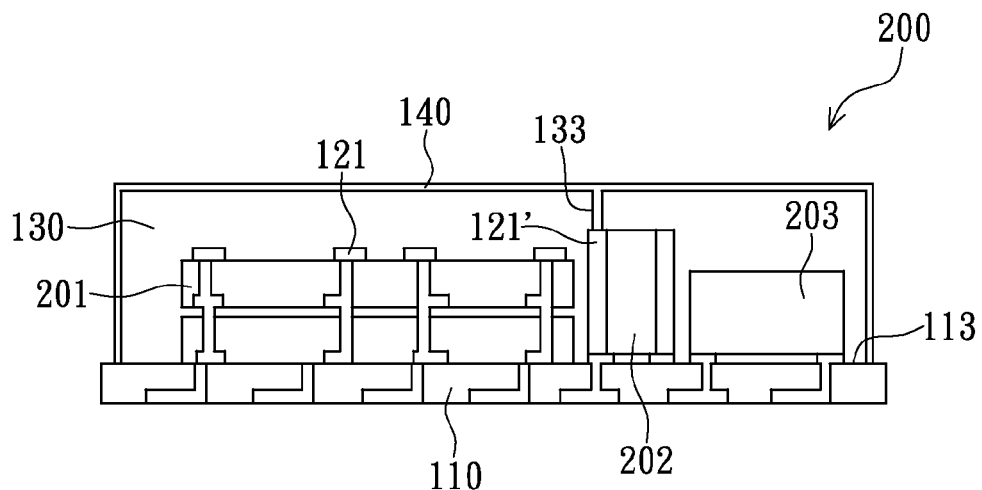

FIG. 3

ELECTRONIC DEVICE AND MANUFACTURING METHOD THEREOF

BACKGROUND OF THE INVENTION

1. Field of the Invention

The instant disclosure relates to an electronic device and the manufacturing method thereof; in particular, this relates to a conductive layer deposed on the exterior of molding of device and electrically connected to at least one of internal components.

2. Description of Related Art

The integrated device usually includes hundreds to millions of the components such as the resistor, the light emitting diode (LED), the small-signal transistor, the capacitor, the inductor or the power metal-oxide-semiconductor field effect transistor (MOSFET).

The high density of the wires among components or modules that cause some problems, such as electromagnetic interference (EMI). Today's electronic products are required for solving these problems and a manufacturing method thereof has been required.

SUMMARY OF THE INVENTION

This relates to devices and methods for providing electronic device which had at least one conductive layer partially covering the exterior of molding and electrically connected to at least one of internal components through the molding.

In one specific embodiment, methods of forming an electronic device are provided. The methods comprise: providing a substrate; disposing at least one component on the substrate; forming a molding to encapsulate the component and a portion of the substrate; forming a first hole on said molding to expose a ground pad of said component; and forming a first conductive layer to cover the module and be electrically connected to the ground pad.

In order to further the understanding regarding the present invention, the following embodiments are provided along with illustrations to facilitate the disclosure of the present invention, but not to limit the scope of the present invention.

BRIEF DESCRIPTION OF THE DRAWINGS

FIG. 2 shows a flowchart of a manufacturing method of the electronic device according to the embodiment of the instant disclosure;

FIG. 3 shows a cross-sectional diagram of the electronic device according to another embodiment of the instant disclosure;

DETAILED DESCRIPTION OF THE PREFERRED EMBODIMENTS

Figure 1:
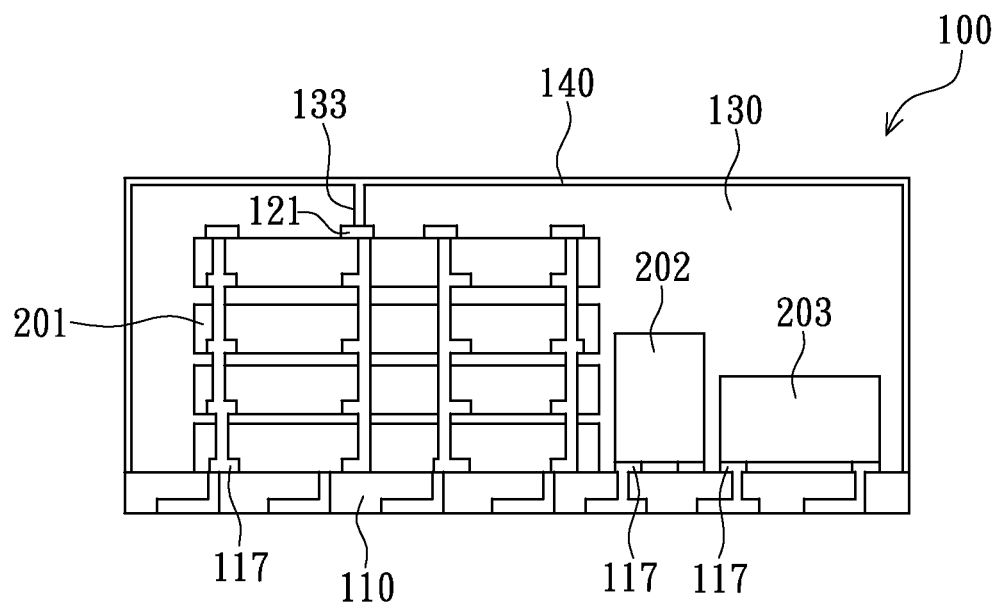
FIG. 1 shows a cross-sectional diagram of the electronic device according to the embodiment of the instant disclosure.
Figure 1A:
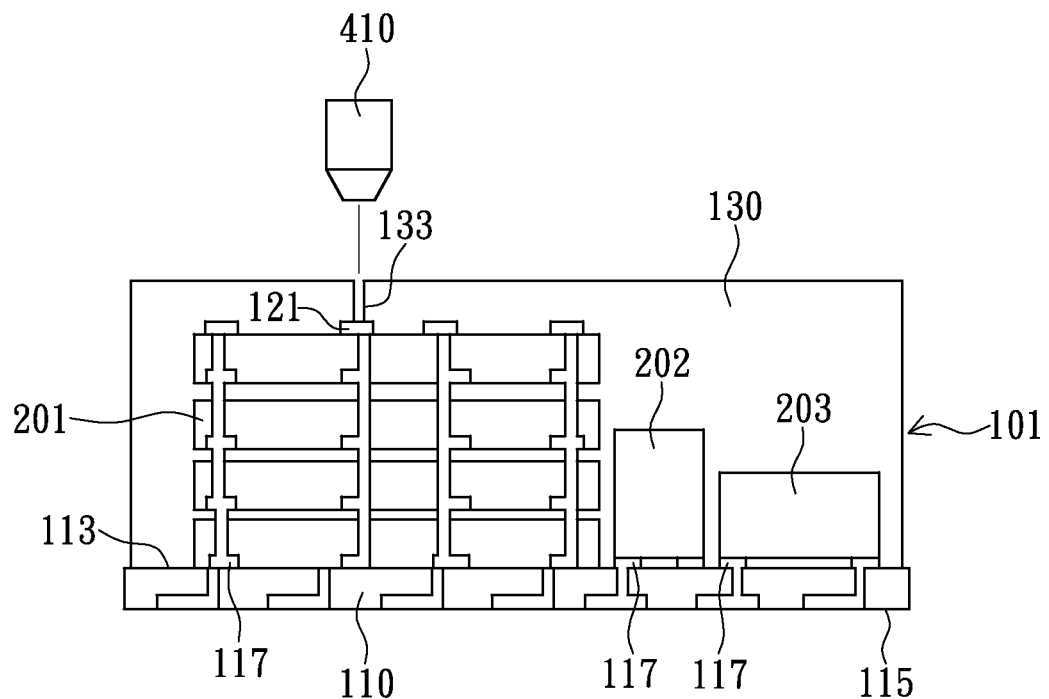
FIG. 1A shows the cross-sectional diagrams of the electronic device of FIG. 1 during the manufacturing process.

FIG. 1 shows a cross-sectional diagram of the electronic device 100 in accordance with the embodiment of the instant disclosure. FIG. 1A illustrates the cross-sectional diagram of electronic device 100 of FIG. 1 during the manufacturing process. As shown in FIG. 1A, module 101 including a substrate 110, components 201, 202 and 203, and a molding 130 is provided firstly. The substrate 110 has a surface 113 and a bottom 115. The substrate 110 has a plurality of the pads 117 and the wire layer (not shown in the figure) pre-disposed thereon. The pads 117 are made of the conductive material to make an electrical connection with the conductive wire (not shown in the figure) or other functional plane, such as the ground plane (not shown in the figure). The pads 117 and the wire layer (not shown in the figure) are mounted on or embedded into the substrate 110. The material of the substrate may vary according to process and the different demands of the product, for example, a semiconductor wafer containing Si for semiconductor industry, a PCB substrate, a glass substrate or other substrate material for other applications.

In the present embodiment, three components 201, 202 and 203 are disposed on the substrate 110. The component 201 is a semiconductor chip stacks. The component 201 and the pads 117 are electrically connected by flip-chip bonding. The components 202 and 203 may be the resistor, the inductor or the capacitor. The component 201 has the ground pads 121 mounted thereon. The ground pads 121 are metal pads and electrically connected to a ground unit (not shown in the figure).

Thereafter, an encapsulation process is applied to form a molding 130 on the substrate 110 to envelope the components 201, 202 and 203 and a portion of the substrate 110. The encapsulation process is for example an over-molding process. The material of the molding 130 can be selected from epoxy resin or silicon. It is worth emphasizing that the upper surface of the molding 130 is flat, and the vertical distance between the upper surface of the molding 130 and the surface 113 of the substrate is essentially larger than the vertical distance between the top of the component 201 and the surface 113 of the substrate 110.

Thereafter, a first hole 133 is formed corresponding to the position of the ground pad 121 on the molding 130 to expose the ground pad 121. The method for forming the first hole 133 is for example a laser drilling process. A laser drill 410 is aligned with the position of the ground pad 121, and then removes a portion of the molding 130 to form the first hole 133 of an inner diameter of such as 80 μm. Because the laser drilling speed for the molding 130 is much larger than for the metal material, drilling the molding 130 is easier than the metal material. Accordingly, while the molding 130 corresponding to the first hole 133 is completely removed and the ground pad 121 is uncovered, the laser drilling speed becomes significantly slower or down to zero. That is, the ground pad 121 would not be removed by the laser drill 410, thereby the ground pad 121 is exposed from the first hole 133. In another case, the method for removing the portion of the molding 130, such as plasma etching, chemical etching or mechanical drilling, etc., may be carried out to form the first hole 133 to expose the ground pad 121. It is worth mentioning that the shape and the size of the first hole 133 are determined by the practical requirements, and the embodiment of the instant disclosure should not become a limitation to the scope of the invention. The laser used in the abovementioned drilling process can be a $CO_2$ laser, a UV-YAG laser or other appropriate ones.

Finally, as shown in FIG. 1, a first conductive layer 140 is formed to cover the module 101 and electrically connected to the ground pad 121. In the embodiment, the first conductive layer 140 is electrically connected to the ground pad 121 to finish the electronic device 100 by conformingly covering the side wall of the first hole 133 and the top surface of the ground pad. In another embodiment, the first conductive layer 140 fills into the first hole 133 to be electrically connected to the ground pad 121. Additionally, the number of the ground pad 121 is provided in accordance with the real demands, which is not a restriction to the scope of the present invention. For example, the first conductive layer 140 can be electrically connected to the ground pads of the same component or different components. The first conductive layer 140 may be formed by performing such as spray coating, electroplating, electrolessplating, evaporation, sputtering process, etc., for depositing a conductive material. The thickness of the first conductive layer 140 is varied with the different materials. The material of the first conductive layer 140 can be selected from such as metal, alloy, conducting polymer and the combinations thereof. The first conductive layer 140 also can be a multi-layer containing the above-mentioned materials.

Please refer to FIG. 2, it shows the manufacturing method of electronic device 100 according to the above-mentioned embodiment. The steps of the method are as below:

Step S1: providing a substrate 110, at least one component (such as the component 201) and a molding 130, wherein the component 201 is disposed on the substrate 110, and the molding 130 encapsulates the component 201 and a portion of substrate 110;

Step S2: forming the first hole 133 on the molding 130 to expose the ground pad 121 of the component 201;

Step S3: forming the first conductive layer 140 covering the module 101 and electrically connected to the ground pad 121 of the component.

(Another Embodiment of the Electronic Device and the Manufacturing Method.)

Please refer to FIG. 3 illustrating the cross-sectional diagram of the electronic device 200 according to another embodiment of the instant disclosure. Only the differences between the aforementioned embodiment and the electronic device 200 and the manufacturing method thereof would be described in detail as follows, the similarities would not be described again. As depicted in FIG. 3, the component 202 having the shortest distance to the top surface of the molding 130 is selected as an example, i.e., in this embodiment, the height of component 202 above the surface 113 is larger than that of the components 201 and 203. In the present embodiment, the components 202 may be the resistor, the inductor or the capacitor. The component 202 has a ground contact, which is disposed the component 202 and serves as the ground pad 121'. One end of the ground pad 121' is electrically connected to the ground unit (not shown in the figure) through the substrate 110.

Subsequently, a first hole 133 is formed on the molding 130 aligning to the position of the ground pad 121' to expose the ground pad 121'. In this embodiment, the vertical distance between the ground pad 121' and the top surface of the molding 130 is smaller than that between the ground pad 121 and the top surface of the molding 130. Finally, the first conductive layer 140, which conformingly covers the molding 130 and the first hole 133, is formed to be electrically connected to the ground pad 121'. The other details of the process as shown in FIG. 1 would not be described here; one having ordinary knowledge in the art can easily understands how to practice this embodiment.

(Another Embodiment of the Electronic Device and the Manufacturing Method Thereof.)

Figure 4:
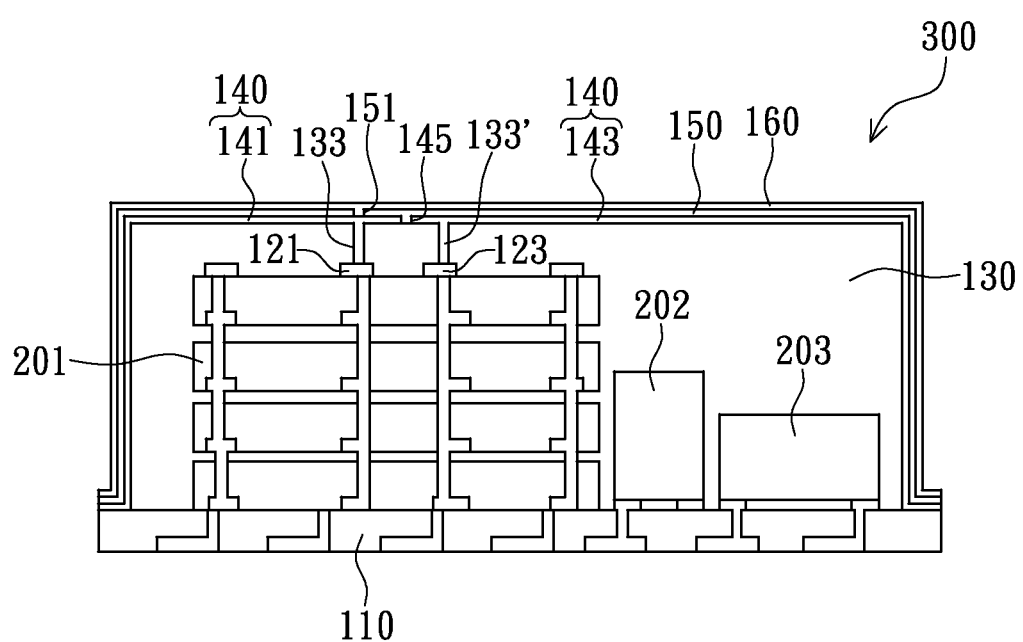
FIG. 4 shows a cross-sectional diagram of the electronic device according to another embodiment of the instant disclosure.
Figure 4A:
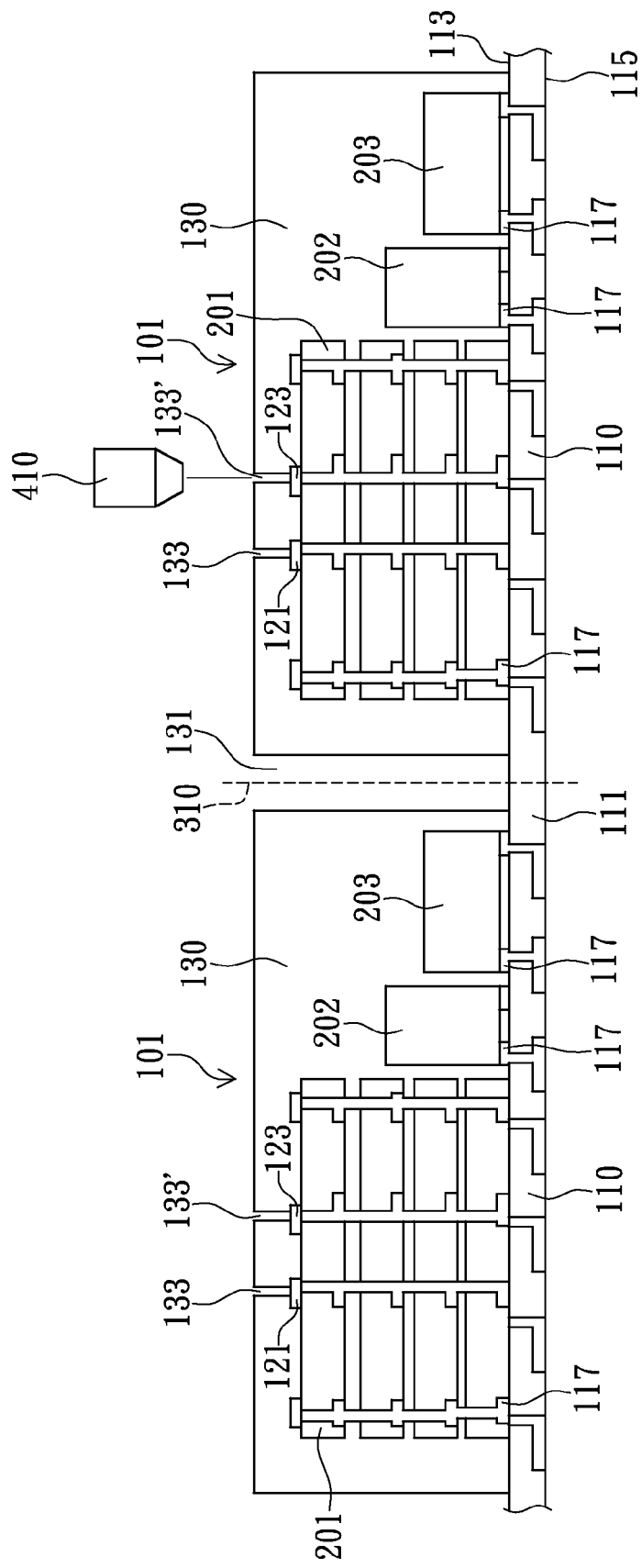
FIGS. 4A to 4G show the cross-sectional diagrams of the electronic device of FIG. 4 during the manufacturing process.
Figure 4B:
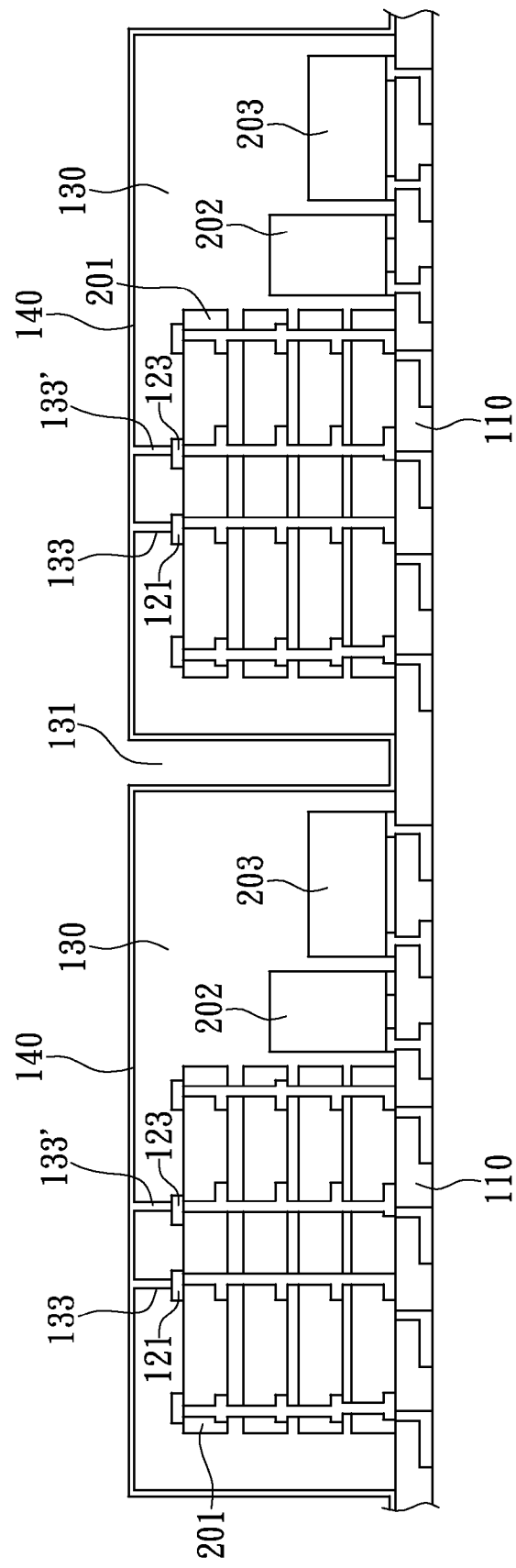
Figure 4C:
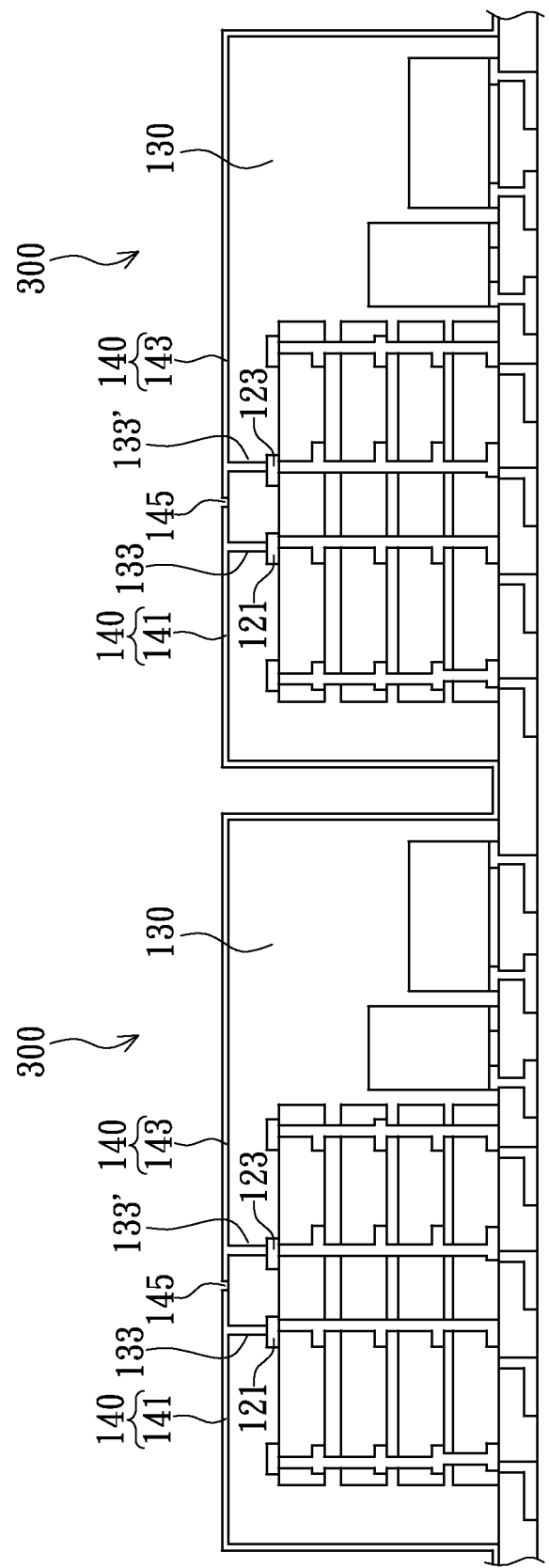
Figure 4D:
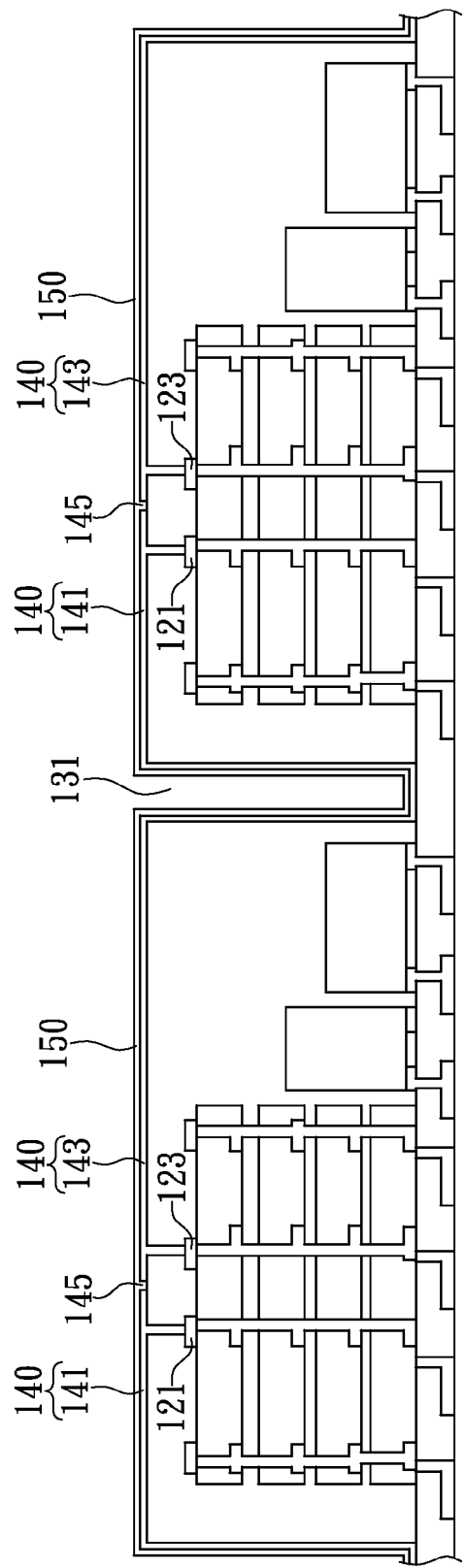
Figure 4E:
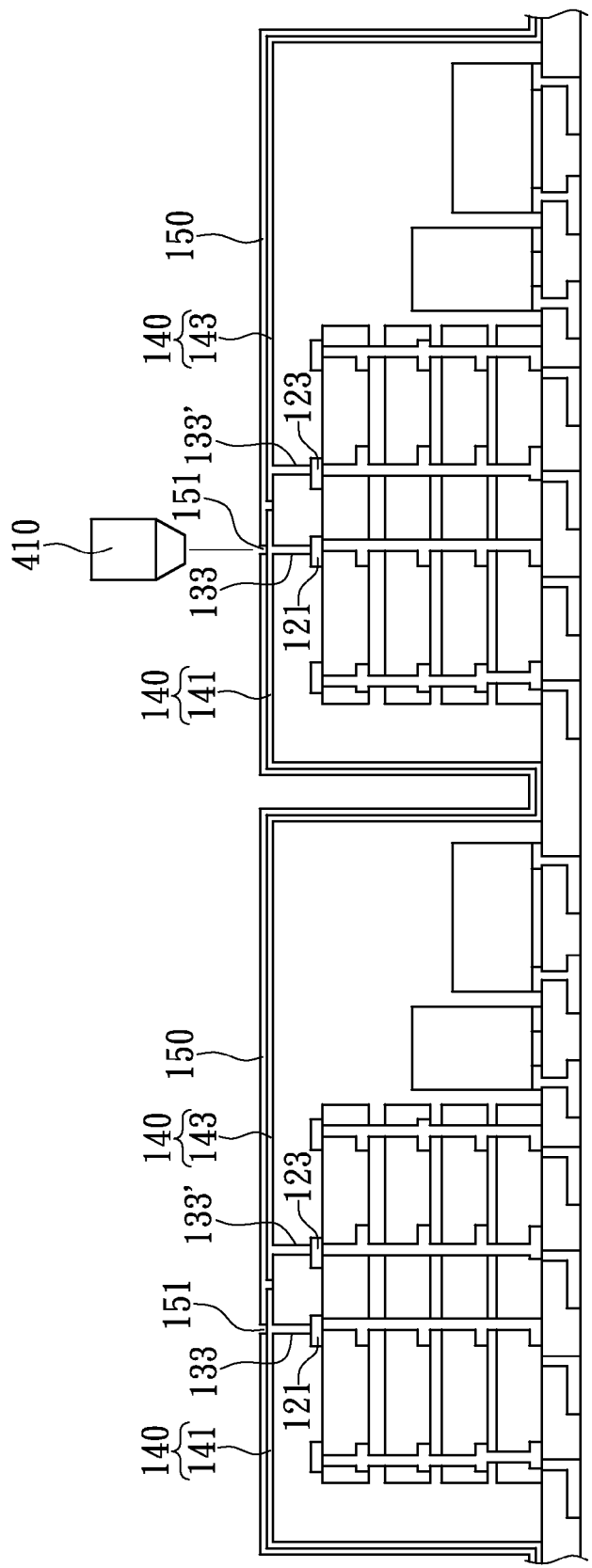
Figure 4F:
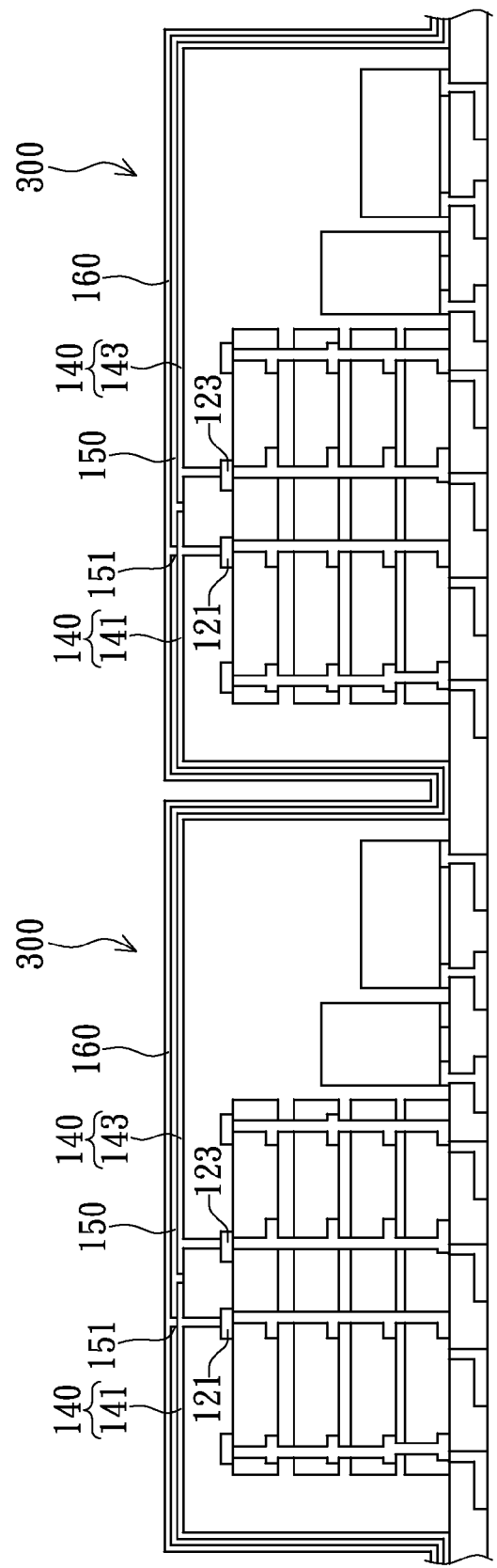
Figure 4G:
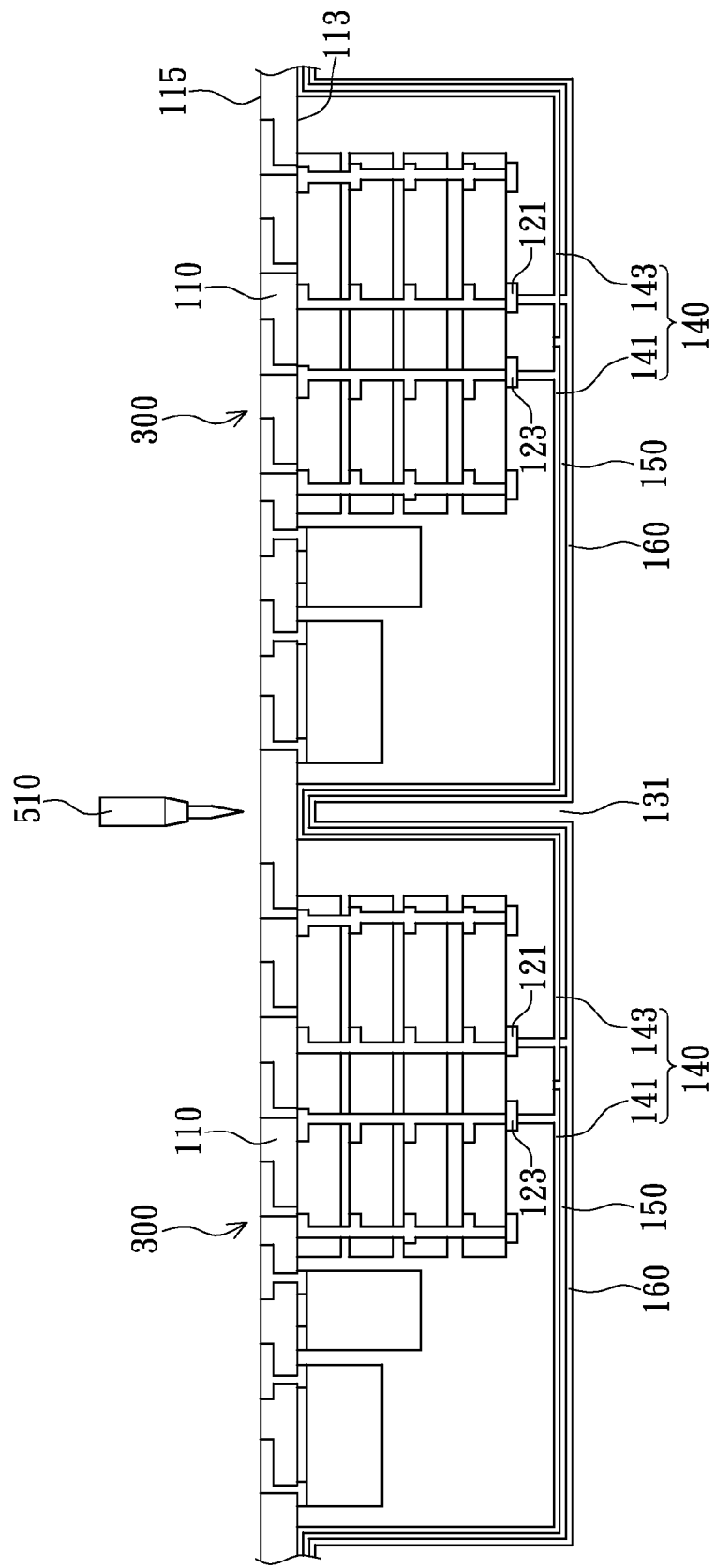
Figure 4H:
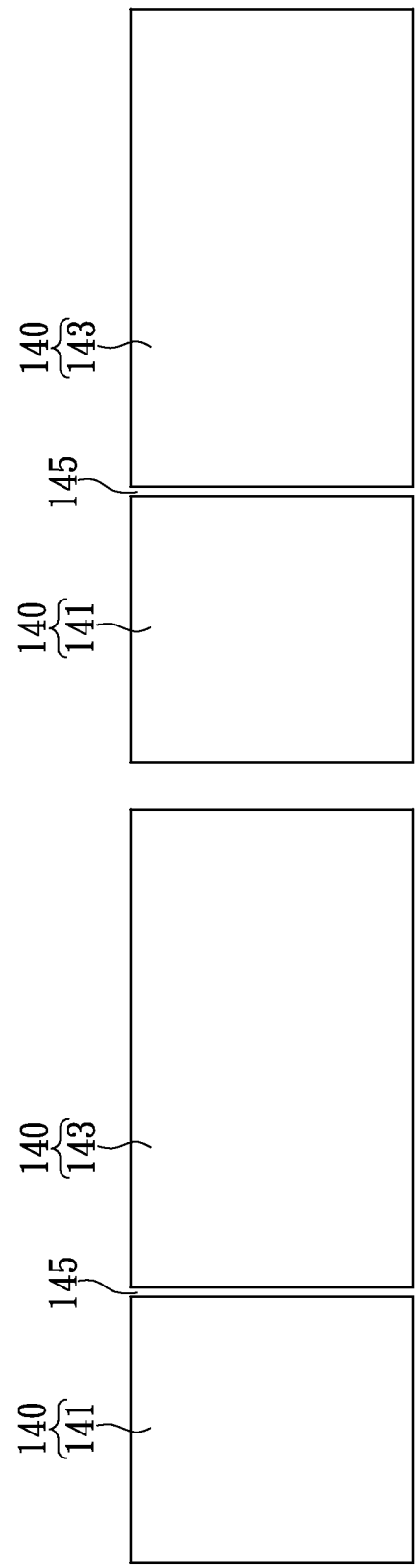
FIG. 4H shows the top view diagram of the first conductive layer of FIG. 4C

Please refer to FIG. 4 and FIGS. 4A to 4H. FIG. 4 shows cross-sectional diagram of the electronic device 300 according to another embodiment of the instant disclosure; FIGS. 4A-4G show the cross-sectional diagrams of the electronic device of FIG. 4 during the manufacturing process; FIG. 4H shows the top view diagram of the first conductive layer 140 of FIG. 4C. Only the differences between the aforementioned embodiments and the electronic device 300 and the manufacturing method thereof would be described in detail as follows, the similarities would not be described again.

First, a module 101, which includes the substrate 110, the components 201, 202 and 203 and the molding 130, is provided. As illustrated in FIG. 4A, a circuit substrate strip 111 having a plurality of the substrate 110 is provided. The substrates 110 are defined by the cutting lines 310 on the circuit substrate strip 111.

A plurality of the components are disposed on each of the substrates 110 and electrically connected with the pads 117. In the embodiment, each substrate 110 has three components 201, 202 and 203 mounted thereon. The component 201 has a ground pad 121 and a power pad 123 mounted thereon. Besides, the types and number of the components disposed on each substrate 110 are in accordance with the real demands, but not become a limitation to the scope of the invention. Each substrate 110 may have different types or number of the components.

An encapsulation process is then performed to form a molding 130 on the substrate 110 to envelope the components 201, 202 and 203 and a portion of the substrate 110. In the present embodiment, while the encapsulation process is carried out, a molding material is used to envelope all of the components 201, 202 and 203 on each substrate 110 and a portion of each substrate 110. A cutting process is subsequently performed to cut the molding material along the cutting lines 310. By removing a portion of the molding material, a trench 131 is formed between the adjacent two modules 101. Thus, the molding material is separated into several individual parts, which are the molding 130 on each substrate 110. At least two differential modules 101, each of which has the substrate 110, are defined by the trench 131. The depth of the trench 131 is substantially equal to the vertical distance between the top of the molding 130 and the surface 113.

Please refer to FIG. 4A again, the first hole 133 corresponding to the position of ground pad 121 is formed on the molding 130 to show up the ground pad 121. The second hole 133' corresponding to the position of power pad 123 is formed on the molding 130 to show up the power pad 123. The methods for forming the first hole 133 and the second hole 133' may be the same, such as by laser drilling process. A laser drill 410 is aligned with the positions of the ground pad 121 and the power pad 123, and then drills the molding 130 to remove a portion of the molding 130. The first hole 133 and the second hole 133', both of which have the inner diameter of such as 80 μm, are formed on the molding 130. Thus, the ground pad 121 and the power pad 123 are bare from the first hole 133 and the second hole 133', respectively. It is worth mentioning that, the number, size and shape of the first hole 133 and the second hole 133' are designed according to the real demands, but not become a limitation to the scope of the present invention.

Please refer to FIG. 4B, the first conductive layer 140 is formed to cover the module 101 and electrically connected to the ground pad 121 and the power pad 123. As illustrated in FIG. 4B, the first conductive layer 140 conformingly covers each of the moldings 130, the first holes 133 and the second holes 133' of the modules 101. The first conductive layer 140 is electrically connected to the ground pads 121 and the power pads 123 via the first holes 133 and the second holes 133', respectively. Specifically, the first conductive layer 140 conformingly covers the side walls of the first holes 133 and the second holes 133' and the top surfaces of the ground pad 121 and the power pad 123 to be electrically connected thereto. Additionally, the first conductive layer 140 may fill into the first hole 133 and the second hole 133' to be electrically connected to the ground pad 121 and the power pad 123.

Please refer to FIG. 4C and FIG. 4H, the steps of forming the first conductive layer 140 further comprises patterning the first conductive layer 140 to separate the first conductive layer into a ground region 141 and a power region 143. The ground region 141 is electrically contacted to the ground pad 121, and the power region 143 is electrically contacted to the power pad 123. As depicted in FIG. 4H, a portion of the first conductive layer 140 is removed by laser ablation to shape a stripe pattern 145 to expose a portion of the molding 130, and isolate the ground region 141 from the power region 143. The ground region 141 is electrically connected to the ground pad 121 via the first hole 133, and the power region 143 is electrically connected to the power pad 123 via the second hole 133'.

Moreover, the shape of the pattern 145 may be designed by one skilled in the art in accordance with the demands of the application; hence, the shape of the pattern 145 is not a limitation to the scope of the present invention. In another embodiment, while the first conductive layer 140 is patterned, a patterned mask over the molding 130 may be provided. That is, a conductive material is deposited on the molding 130 though the patterned mask. Therefore, the conductive material would be only deposited on the bare region, not on the region shielded by the patterned mask to form the patterned first conductive layer 140. And then, the patterned first conductive layer 140 can be formed to separate the ground region 141 from the power region 143.

Please refer to FIG. 4D, a passivation layer 150 is formed to cover the first conductive layer 140. In this embodiment, the passivation layer 150 is, for example, a coating with low dielectrics. The passivation layer 150 conformingly shelters the ground region 141, the power region 143, the side walls of the pattern 145 and the top surface of the molding 130 which is exposed by using the pattern 145. The passivation layer 150 has a thickness of about 30 μm, for example. The material for the passivation layer 150 having low dielectric property and heat resistance is preferred, such as, but not to limit, polyimide (PI), polyethylene terephthalate (PET) or, benzocyclobutane (BCB) in the embodiment of the instant disclosure.

As shown in FIG. 4E, an opening 151 is formed on the passivation layer 150 to expose a portion of the ground region 141. The shape and the position of the opening 151 just allow the opening 151 to expose the ground region 141 and need not to be limited. In this embodiment of the instant disclosure, the opening is located in alignment with the first hole 133 and formed by the laser drilling process. The laser drill 410 is aligned with the position of the first hole 133 to drill the passivation layer 150, and then a portion of the passivation layer 150 is removed to form the opening 151. In another embodiment, the method for removing the portion of the passivation layer 151, such as, mechanical drilling, plasma etching or chemical etching, etc., may be carried out to form the opening 151. One having ordinary skill in the art can select the process according to the practical demands. The aforementioned methods for forming the opening 151 are not used to limit the scope of the invention.

Thereafter, as shown in FIG. 4F, a second conductive layer 160 is formed to cover the passivation layer 150 and be electrically connected to the ground region 141 of the first conductive layer 140 through the opening 151. In the embodiment, the conductive material of the second conductive layer 160 is deposited by the spray coating on the surface of the passivation layer 150, the side walls of the opening 151 and a portion of the ground region 141 appeared from the opening 151. The conductive material is cured subsequently to form the second conductive layer 160. The material of the second conductive layer 160 can be selected from metal, alloy, conducting polymer and the combinations thereof. The second conductive layer 160 also may be a multi-layer containing the above-mentioned materials.

Please refer to FIG. 4G, finally, the substrate 110 is cut from the bottom 115 or the top of the substrate 110 along the trench 131 to separate the adjacent two electronic devices 300. Specifically, cutting the substrate 110 is carried out by the blade 510 sawing process or the laser cutting process to separate the substrate 110, the first conductive layer 140 coving the surface 113 of the substrate 110, the passivation layer 150 and the second conductive layer 160, so that the fabrication of the individual electronic devices 300 is completed.

In addition to the abovementioned method shown in the FIG. 2, after step S1 and before forming the first conductive layer 140, the manufacturing method of the electronic devices 300 further includes forming the second hole 133' to expose the power pad 123 of the component 201. Furthermore, the step of forming the first conductive layer 140 includes patterning the first conductive layer 140 to separate the ground region 141 from the power region 143. The ground region 141 is electrically connected to the ground pad 121; and the power region 143 is electrically connected to the power pad 123.

Additionally, according to different products, the above process further includes forming the passivation layer 150 to cover the first conductive layer 140. The passivation layer 150 has an opening 151 to uncover a portion of the ground region 141. Subsequently, a second conductive layer 160 is formed to cover the passivation layer 150 and electrically connected to the ground region 141 through the opening 151.

(Another Embodiment of the Electronic Device and the Manufacturing Method Thereof.)

Figure 5:
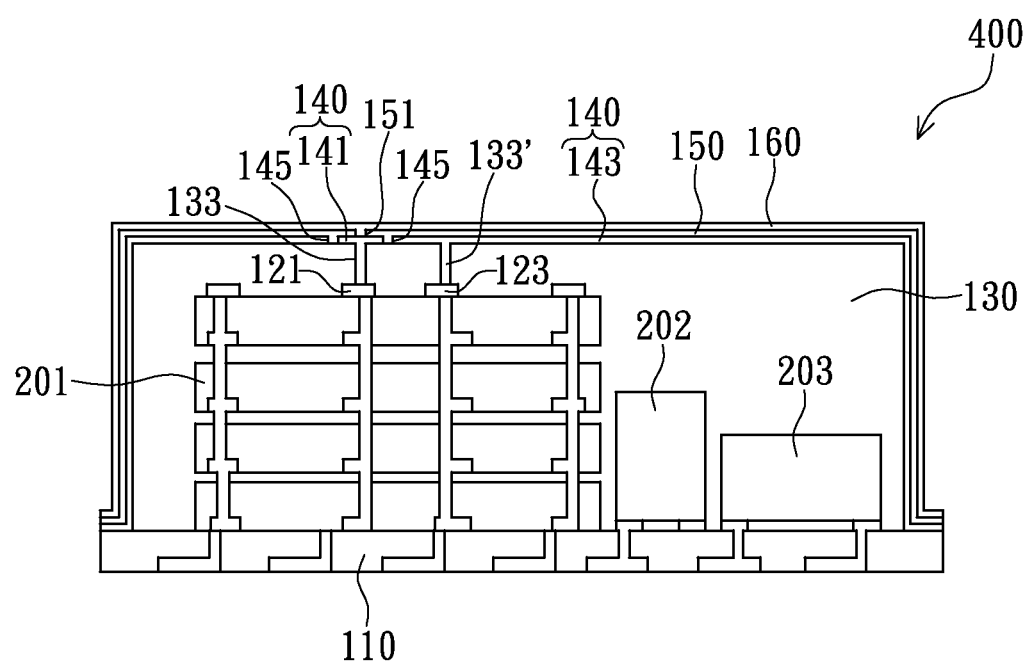
FIG. 5 shows a cross-sectional side view diagram of the electronic device according to another embodiment of the instant disclosure.
Figure 5A:
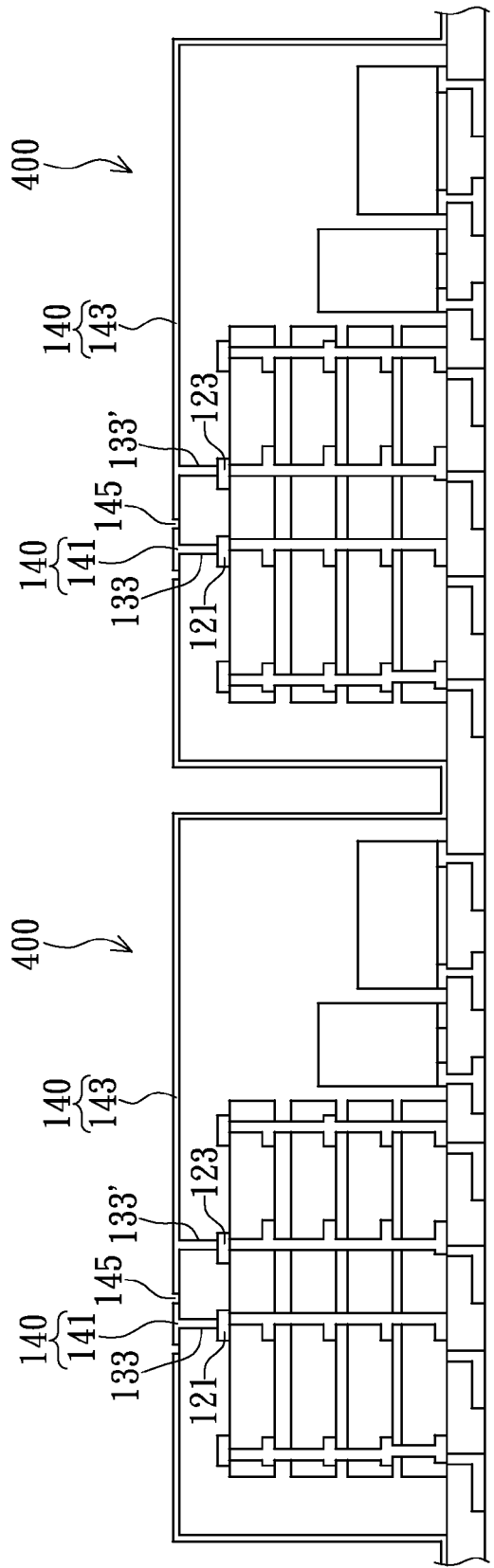
FIGS. 5A to 5B show the cross-sectional diagrams of the electronic device of FIG. 5 during the manufacturing process.
Figure 5B:
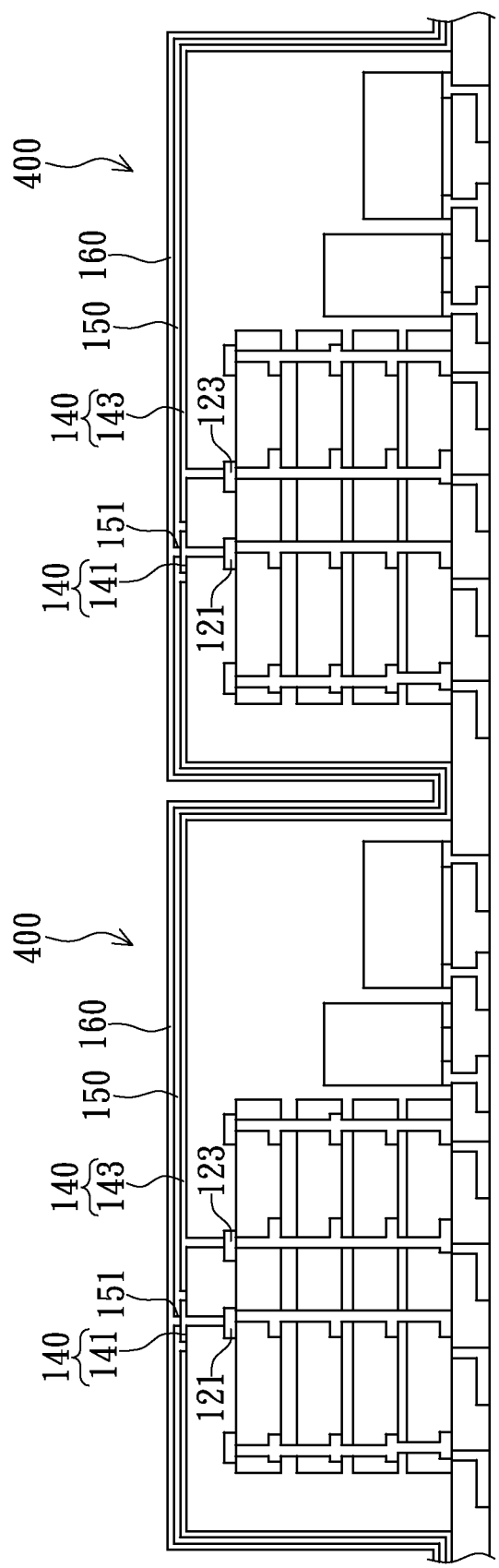
Figure 5C:
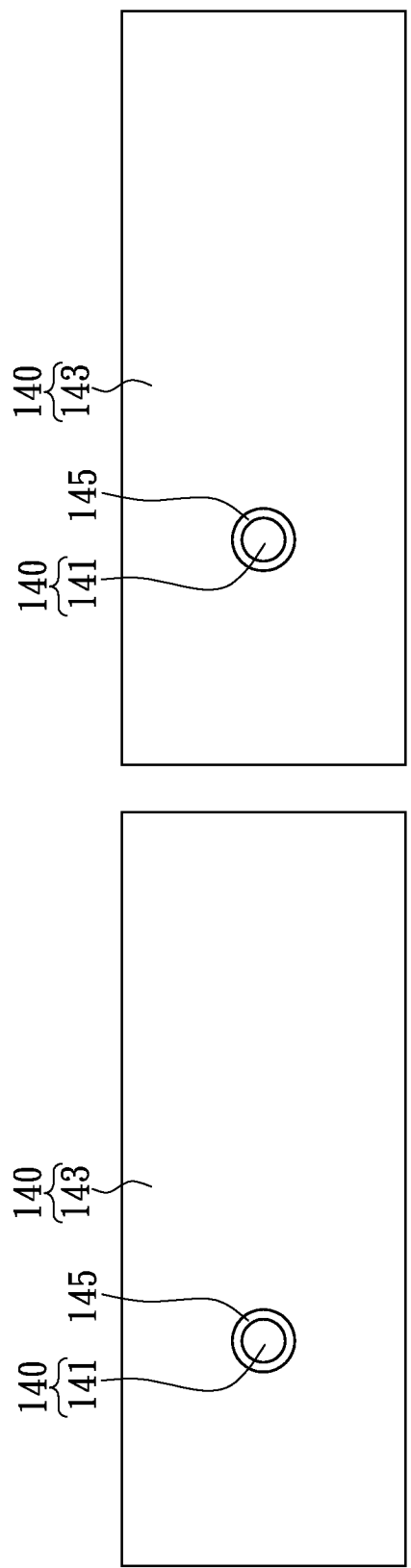
FIG. 5C shows the top view diagram of the first conductive layer of FIG. 5A

Please refer to FIG. 5, incorporating with FIGS. 5A through 5C. FIG. 5 shows the cross-sectional diagram of the electronic device 400 according to another embodiment of the instant disclosure. FIGS. 5A to 5B show the cross-sectional diagrams of the electronic device 400 of FIG. 5 during the manufacturing process. FIG. 5C shows the top view diagram of the first conductive layer 140 of FIG. 5A. Only the differences between the aforementioned embodiment and the electronic device 400 and the manufacturing method thereof would be described in detail as follows, the similarities would not be described again. As depicted in FIG. 5C, the pattern 145 of the embodiment may be ring-shaped and surround the first hole 133. The pattern 145 is used to expose a portion of the molding 130 and separate the first conductive layer 140 into the ground region 141 and the power region 143. The ground region 141 having a circle shape is located above the first hole 133 and makes an electrical contact with the ground pad 121 via the first hole 133. The other detail processes of the FIGS. 5A to 5C are the same as the description of FIGS. 1 through 4, one having ordinary skill in the art may recognize how to practice the method of the embodiment, which would not be described again.

(Another Embodiment of the Electronic Device and the Manufacturing Method Thereof.)

Figure 6:
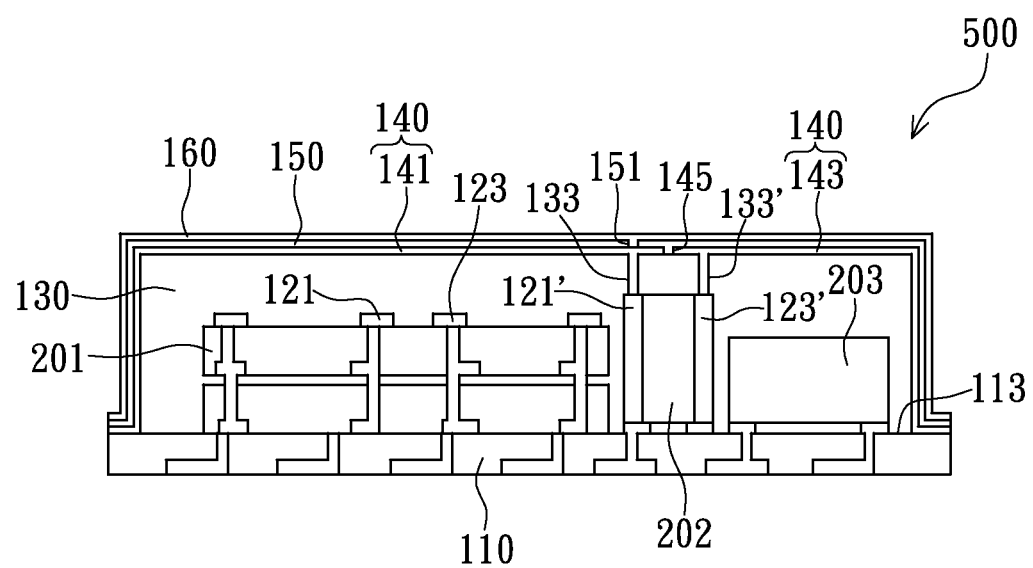
FIG. 6 shows a cross-sectional diagram of the electronic device according to another embodiment of the instant disclosure.

Please refer to FIG. 6, which shows a cross-sectional diagram of the electronic device 500 according to another embodiment of the instant disclosure. Only the differences between the aforementioned embodiment and the electronic device 500 and the manufacturing method thereof would be described in detail as follows, the similarities would not be described again. As shown in FIG. 6, the component 202 having the shortest distance to the top surface of the molding 130 is selected as an example, i.e., in this embodiment, the height of component 202 above the surface 113 is larger than that of the components 201 and 203 above the surface 113. In the present embodiment, the components 202 may be the resistor, the inductor or the capacitor. The component 202 has a ground contact and a power contact itself which are disposed thereon and disconnected from each other. The ground contact and the power contact serve as the ground pad 121' and the power pad 123' of the component 202, respectively. The power pad 123' is electrically connected to the power unit (not shown in the figure), and the ground pad 121' is electrically connected to the ground unit (not shown in the figure).

Subsequently, a first hole 133 and a second hole 133' are drilled on the molding 130 in alignment with the positions of the ground pad 121' and the power pad 123', respectively, to expose the ground pad 121' and the power pad 123'. The patterned first conductive layer 140 covers the molding 130, the first hole 133 and the second hole 133'. The patterned first conductive layer 140 includes the ground region 141 and the power region 143. The ground region 141 and the ground pad 121' make an electrical connection via the first hole 133. The power region 143 and the power pad 123' make an electrical connection via the second hole 133'.

In another embodiment, the first conductive layer 140 can select the ground pad and the power pad mounted on the other component to make the electrical connections. Moreover, the number of the ground pad and the power pad is determined according to the practical requirements, and not a limitation to the scope of the present invention. For example, the ground region 141 may be electrically contacted with the ground pads of the same component or different components, and/or the power region 143 may be electrically contacted with the power pads of the same component or different components. The other details of the process as shown in FIGS. 1 to 4 would not be described here; one having ordinary knowledge in the art can easily understands how to practice this embodiment.

(The Embodiment of the Manufacturing Method of Electronic Device)

Figure 7:
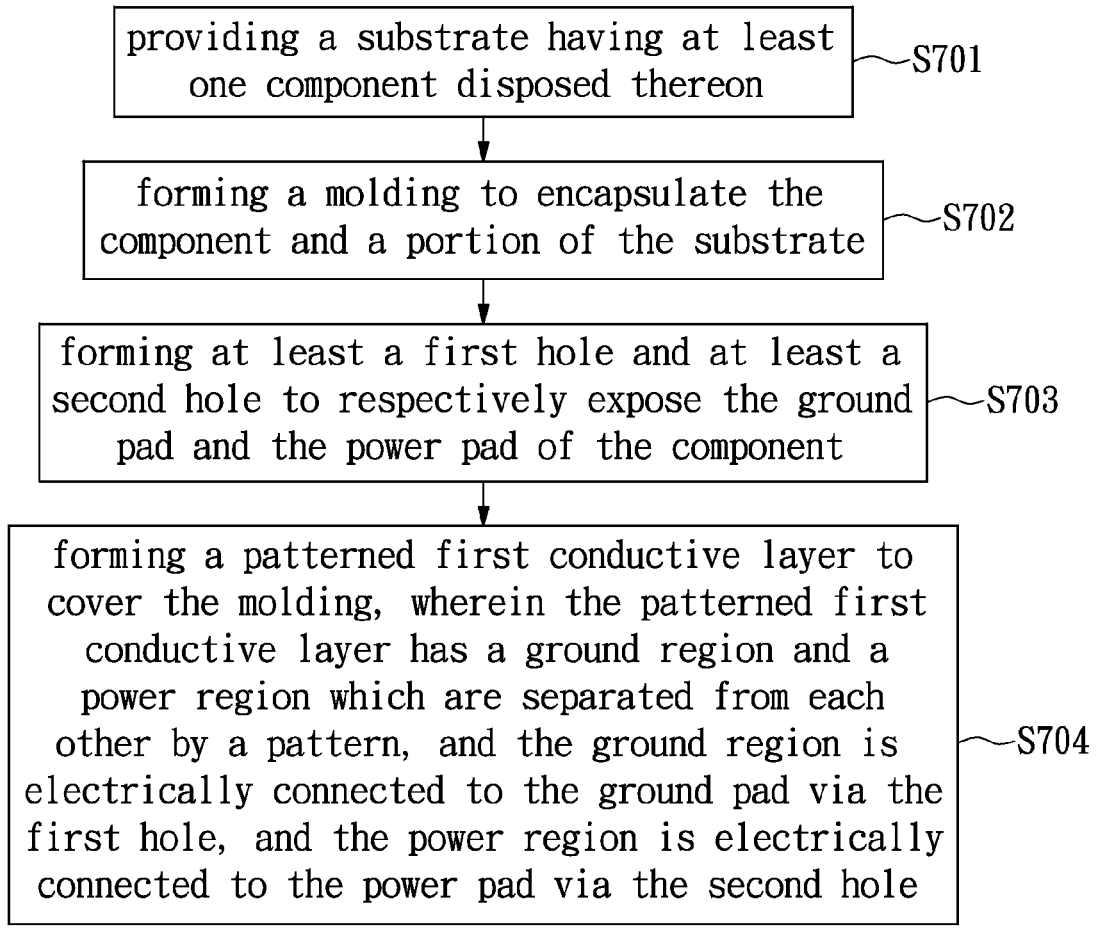
FIG. 7 shows a flowchart of a manufacturing method of the electronic device according to another embodiment of the instant disclosure.

Please refer to FIG. 7, which shows a flowchart of a manufacturing method of the electronic device according to the embodiment. Specifically, the method comprises: providing a substrate having at least one component disposed thereon (step S701); forming the molding to encapsulate the component and a portion of the substrate (step S702); forming at least a first hole and at least a second hole to expose the ground pad and the power pad of the component, respectively (step S703); forming a patterned first conductive layer to cover the molding, wherein the patterned first conductive layer has a ground region and a power region which are separated from each other by a pattern, and the ground region is electrically connected to the ground pad via the first hole, and the power region is electrically connected to the power pad via the second hole (step S704).

According to different products, the abovementioned method further includes forming a passivation layer to cover the patterned first conductive layer; and then forming an opening to expose a portion of the ground region; and forming a second conductive layer to cover the passivation layer and electrically connect to the ground region through the opening.

In summary, an electronic device and manufacturing method thereof are provided in the embodiments of the instant disclosure. By configuring the first conductive layer on the molding to electrically be connected to the ground pads of the same component or different components, the substrate needs not any additional wires. In the embodiment of another application, the ground region and the power region of the first conductive layer on the molding are electrically contacted with the ground pad and the power pad of the component, respectively, so that the need of the substrate wires is reduced. Furthermore, the ground pad of the embodiment of the invention is disposed on the component. In comparison with the prior art, in which the ground pad is disposed on the substrate, the distance between the surface of the molding and the ground pad is shorter. Thus, the depth of the first hole needs not so deep that the yield rate of the conductivity of the first hole becomes better.

Additionally, since the ground pad is configured on the component instead of on the substrate, the area of the surface of the substrate may be reduced to minimize the package volume of the semiconductor device and have the advantage for design of the miniature products.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A manufacturing method of electronic device having at least one module, comprising:
   providing a substrate;
   disposing at least one component on the substrate;
   forming a molding to encapsulate the component and a portion of the substrate;
   forming at least one first hole on said molding to expose a ground pad of said component;
   forming at least one second hole on said molding to expose a power pad of the component;
   subsequently, forming a first conductive layer to conformingly cover the module molding and be electrically connected to the ground pad through the at least one first hole and the power pad through the at least one second hole;
   patterning said first conductive layer to separate the first conductive layer into a ground region and a power region, wherein the ground region is electrically connected to the ground pad and the power region is electrically connected to the power pad, and wherein a majority of an upper surface of the module molding is covered by the ground region and the power region;
   forming a passivation layer to cover said first conductive layer, wherein the passivation layer has an opening to expose a portion of the ground region; and
   forming a second conductive layer to cover the passivation layer and be electrically connected to the ground region through the opening.

2. The manufacturing method according to claim 1, wherein the ground pad is the most proximate to the surface of the molding.

3. The manufacturing method according to claim 1, wherein the first conductive layer fills into the first hole and is electrically connected to the ground pad via the first hole.

4. The manufacturing method according to claim 1, wherein the first conductive layer is electrically connected to a pad of the substrate.

5. The manufacturing method according to claim 1, wherein both of the ground pad and the power pad are proximately to the surface of the molding.

6. The manufacturing method according to claim 1, wherein the ground region and the power region are separated from each other by a ring-shaped pattern or a strip-shaped pattern.

7. A electronic device having at least one module, comprising:
   a substrate;
   at least one component disposed on the substrate;
   a molding encapsulating the component and a portion of the substrate, wherein the molding has a first hole and a second hole to respectively expose a ground pad and a power pad of the component; and
   a first conductive layer conformingly covering a majority of an upper surface of the molding, wherein the first conductive layer includes a ground region and a power region separated from each other by a pattern, the ground region is electrically connected to the ground pad through the first hole, and the power region is electrically connected to the power pad through the second hole;
   a passivation layer covering said first conductive layer and having an opening to expose a portion of the ground region; and
   a second conductive layer covering said passivation layer and electrically connected to the ground region through the opening.

8. The electronic device according to claim 7, wherein the ground pad is the most proximate to the surface of the molding.

9. The electronic device according to claim 7, wherein said first conductive layer conformingly covers the module and is electrically connected to the ground pad through the first hole.

10. The electronic device according to claim 7, wherein the first conductive layer fills into the first hole to be electrically connected to the ground pad via the first hole.

11. The electronic device according to claim 7, wherein first conductive layer is electrically connected to a pad of the substrate.

12. The electronic device according to claim 7, wherein both of the ground pad and the power pad are proximate to the surface of the molding.

13. The electronic device according to claim 7, wherein the pattern is ring-shaped or strip-shaped.

14. A manufacturing method of electronic device, comprising:
   providing a substrate having at least one component;
   forming a molding to encapsulate the component and a portion of the substrate;
   forming a first hole and a second hole on said molding to expose a ground pad and a power pad of the component, respectively;
   subsequently, forming a patterned first conductive layer conformingly covering a majority of an upper surface of the molding, wherein the patterned first conductive layer comprises a ground region and a power region which are separated from each other by a pattern, and the ground region is electrically connected to the ground pad via the first hole and the power region is electrically connected to the power region via the second hole;
   forming a passivation layer to cover the patterned first conductive layer; forming an opening on the passivation layer to expose a portion of the ground region; and
   forming a second conductive layer to cover the passivation layer and be electrically connected to the ground region via the opening.

* * * * *